United States Patent [19]
Peng et al.

[11] Patent Number: 6,156,593
[45] Date of Patent: Dec. 5, 2000

[54] METHOD FOR FABRICATING SALICIDE CMOS AND NON-SALICIDE ELECTROSTATIC DISCHARGE PROTECTION CIRCUIT IN A SINGLE CHIP

[75] Inventors: Chun-Hang Peng; King-Yu Lu, both of Hsinchu, Taiwan

[73] Assignee: United Microelectronics Corp., Taiwan

[21] Appl. No.: 09/123,009

[22] Filed: Jul. 27, 1998

[30] Foreign Application Priority Data

Mar. 30, 1998 [TW] Taiwan ................................. 87104766

[51] Int. Cl.[7] .................................................. H01L 21/765
[52] U.S. Cl. .......................... 438/200; 438/218; 438/294; 438/302; 438/305; 438/683
[58] Field of Search ..................................... 438/200, 218, 438/296, 297, 683, FOR 196, FOR 216, FOR 217, 221, 294, 302, 303

[56] References Cited

U.S. PATENT DOCUMENTS

5,262,344 11/1993 Mistry .
5,413,969 5/1995 Huang .
5,589,423 12/1996 White et al. .
5,620,920 4/1997 Wilmsmeyer .
5,744,839 4/1998 Ma et al. .
5,897,348 4/1999 Wu .
5,920,774 7/1999 Wu .
5,953,601 9/1999 Shiue et al. .
5,994,176 11/1999 Wu .
5,998,247 12/1999 Wu .

*Primary Examiner*—George Fourson

[57] ABSTRACT

A method of fabricating an ESD protection circuit without salicide formation is described. First, isolation regions and gate structures are formed on a semiconductor substrate, then device regions and ESD circuit regions are then defined. Next, a first dielectric layer is deposited the over entire semiconductor substrate, and heavily doped source/drain regions are formed in ESD protection circuit region. Next, a second dielectric layer and the first dielectric layer of NMOS areas are etched to form spacers on the sidewalls of the gate structures. Then, $N^+/P^+$ ion implantation are performed to form heavily doped source/drain regions of NMOS and PMOS, respectively. Finally, salicide process is performed to form silicide over the exposed surface of the gate, source/drain regions in the NMOS and PMOS active device regions.

18 Claims, 15 Drawing Sheets

METHOD FOR FABRICATING SALICIDE CMOS AND NON-SALICIDE ELECTROSTATIC DISCHARGE PROTECTION CIRCUIT IN A SINGLE CHIP

BACKGROUND OF THE INVENTION (1) Field of the Invention

This invention relates generally to the field of integrated circuits (ICs) fabrication, and more particularly, to a process of forming non-silicide electrostatic discharge (ESD) protection circuit with reduced number of masks and lithography steps.

(2) Description of the Prior Art

The input signals to a metal-oxide-semiconductor (MOS) IC are fed to the gates of MOS transistors. If the voltage applied to the gate oxide insulator becomes excessive, the gate oxide can break down. The dielectric breakdown strength of $SiO_2$ is approximately $8 \times 10^6$ V/cm; thus, a 150 Å gate oxide will not tolerate voltages greater than 12V without breaking down. Although this is well in excess of the normal operating voltages of 5V integrated circuits, voltages higher than this may be impressed upon the inputs to the circuits during either human-operator or mechanical handling operations. Please see references such as "Silicon Processing for the VLSI ERA, Volume 2" by Wolf, 1990 (the entire disclosure of which is herein incorporated by reference).

The main source of such voltages is triboelectricity (electricity caused when two materials are rubbed together). A person can develop very high static voltage (i.e., a few hundred to a few thousand volts) simply by walking across a room or by removing an integrated circuit from its plastic package, even when careful handling procedures are followed. If such a high voltage is accidentally applied to the pins of an IC package, its discharge (referred to as electrostatic discharge, or ESD) can cause breakdown of the gate oxide of the devices to which it is applied. The breakdown event may cause sufficient damage to produce immediate destruction of the device, or it may weaken the oxide enough that it will fail early in the operating life of the device (and thereby cause device failure).

All pins-of MOS ICs must be provided with protective circuits to prevent such voltages from damaging the MOS gates. The need for such circuits is also mandated by the increasing use of VLSI devices in such high-noise environments as personal computers, automobiles, and manufacturing control systems. These protective circuits, normally placed between the input and output pads on a chip and the transistor gates to which the pads are connected, are designed to begin conducting or to undergo breakdown, thereby providing an electrical path to ground (or to the power-supply rail). Since the breakdown mechanism is designed to be nondestructive, the circuits provide a normally open path that closes only when a high voltage appears at the input or output terminals, harmlessly discharging the node to which it is connected.

In recent years, the sizes of the MOS transistors have become continuously smaller so that the packing densities of these IC devices have increased considerably. As the sizes of the capacitors become smaller, so as the resistance values of the MOS transistors are increasing, that reduces the operational speed of the IC devices, causing performance problems. Therefore, so-called salicide process has been developed to reduce the resistance of the MOS transistors. Unfortunately, the salicide process will reduce the capacity of the ESD protection circuit.

In order to solve such a problem, an ESD protection circuit without salicide that is incorporated with MOS transistors with salicide has been proposed. Referring now to FIGS. 1A–1H, the conventional fabrication method of an ESD protection circuit without salicide formation is depicted.

Figure 1A:
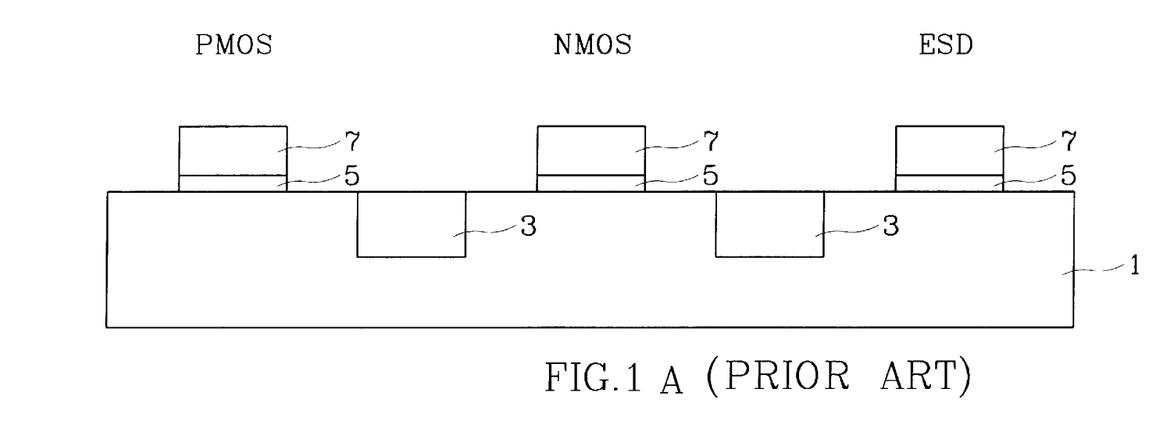
FIGS. 1A to 1H show process representations of an ESD protection circuit without salicide formation formed by a conventional four-mask process.

First, the process before gate patterning is similar to a typical MOS fabrication process, which includes well and isolation 3 formations on a semiconductor substrate 1, device regions and ESD circuit regions definition on the semiconductor substrate 1, threshold voltage ($V_{th}$) adjust implantation, gate oxide 3 growth, polysilicon 5 deposition and gate patterning. The cross-sectional view of the semiconductor substrate 1 after gate patterning is shown in FIG. 1A.

Figure 1B:
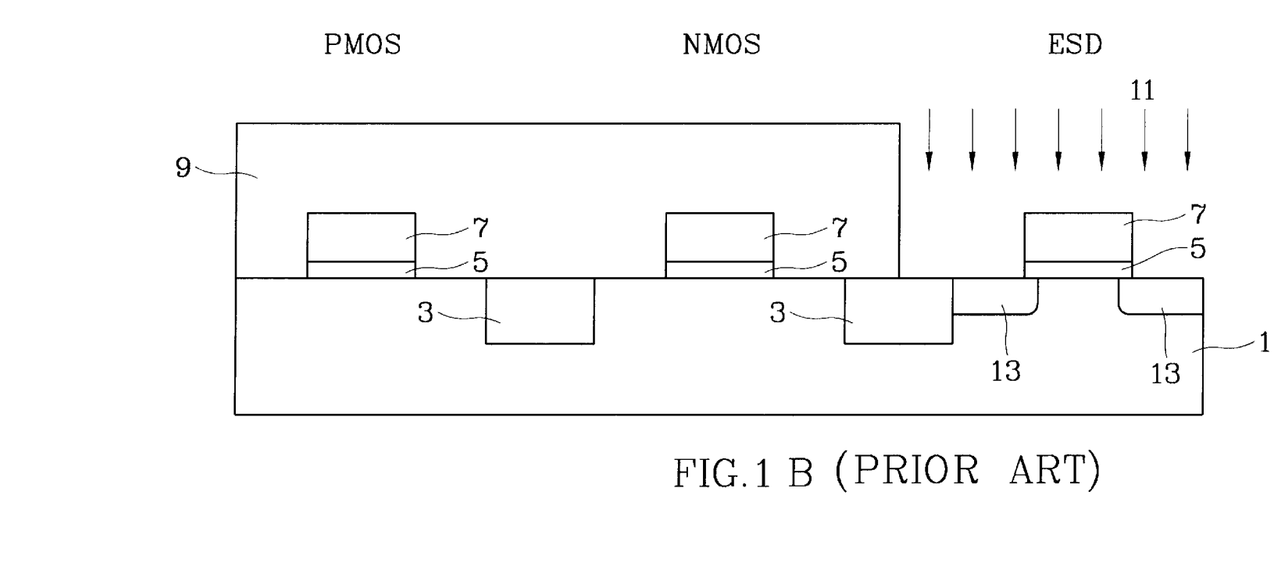

Then, after gate patterning, a first photoresist pattern 9 is created to mask areas other than ESD devices. The high dosage implantation 11 for ESD protection is processed to form heavily doped source/drain regions 13 for ESD protection circuit as shown in FIG. 1B.

Figure 1C:
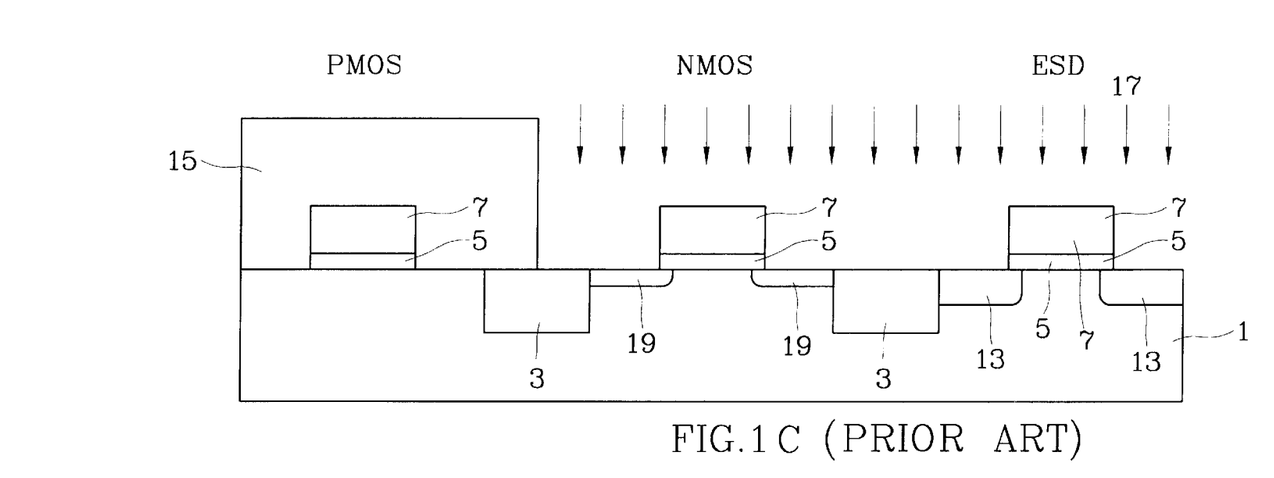
Figure 1D:
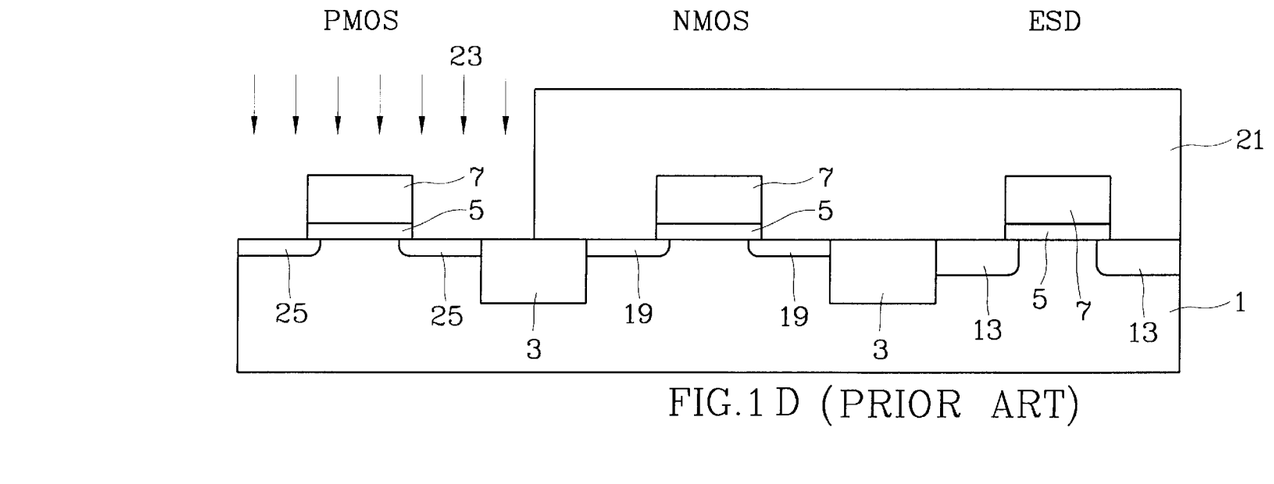

Next, PMOS area is then masked by a second photoresist pattern 15 and N type lightly doped drain (NLDD) implantation 17 is performed to form NLDDs 19 as shown in FIG. 1C. Then NMOS is masked by a third photoresist pattern 15 and PLDD 25 is implanted 23 as shown in FIG. 1D.

Figure 1E:
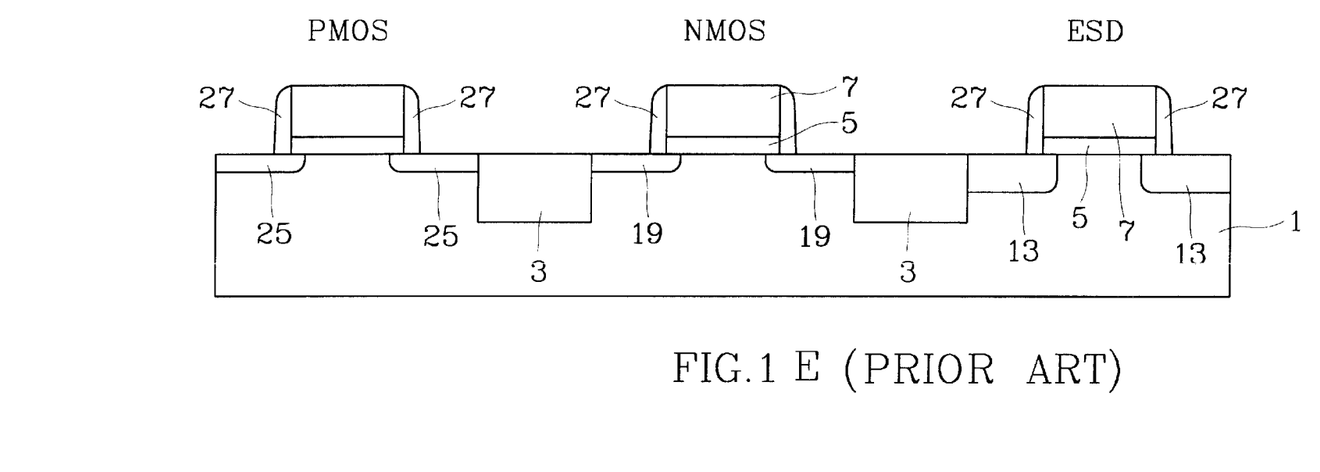
Figure 1F:
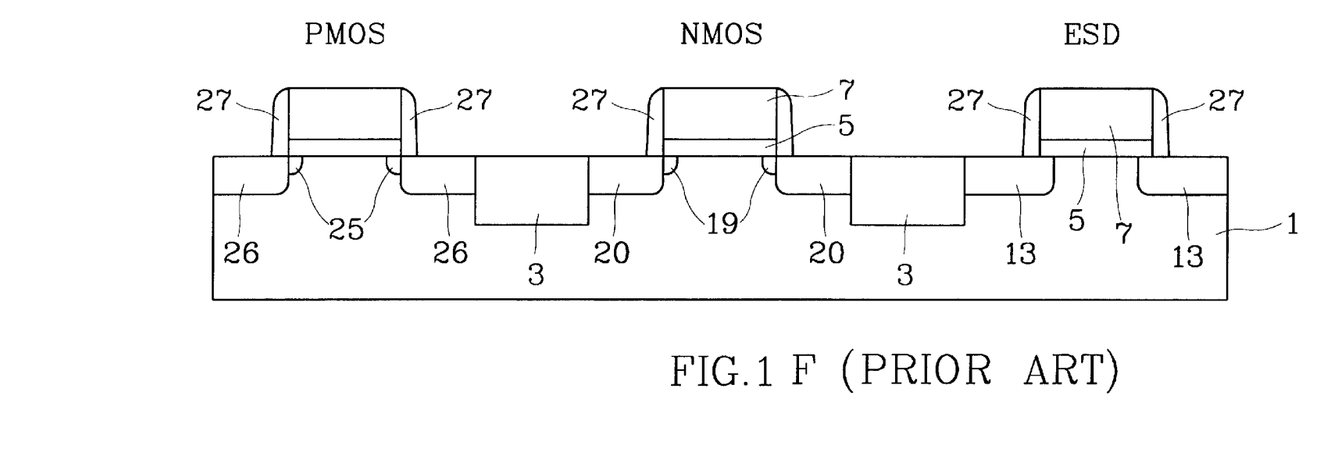

Then, sidewall spacers 27 are formed by depositing and etching an oxide layer as shown in FIG. 1E. $N^+/P^+$ implantations are then performed by masking related areas to form $N^+/P^+$ source/drain regions 20, 26, respectively. The cross-sectional view of the semiconductor substrate 1 after $N^+/P^+$ implantation is shown in FIG. 1F.

Figure 1G:
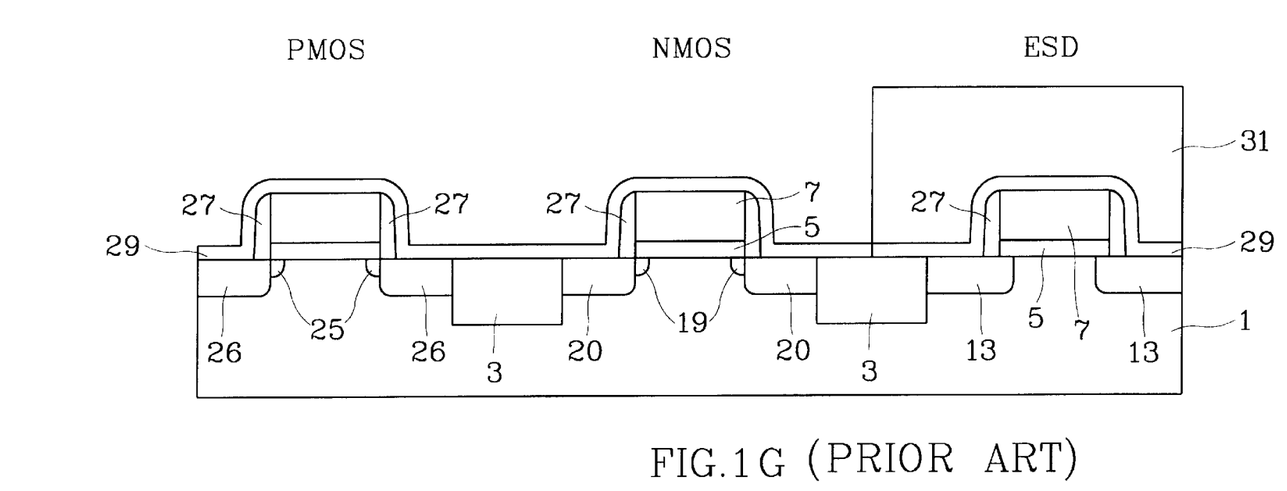

Next, cap oxide layer 29 is then formed over the entire semiconductor substrate 1 surface, followed by one extra fourth photoresist mask 31 (here we call this mask as SAB, standing for salicide blocking) to define non-salicide areas and subsequent oxide etching as shown in FIG. 1G. The masking area depends on necessity. For example, if the gate of the ESD circuit needs to remain salicided, then the gate are would be exposed for further salicidation. The distance between masking edge and gate edge also depends on ESD requirements. It is depicted as FIG. 1G.

Figure 1H:
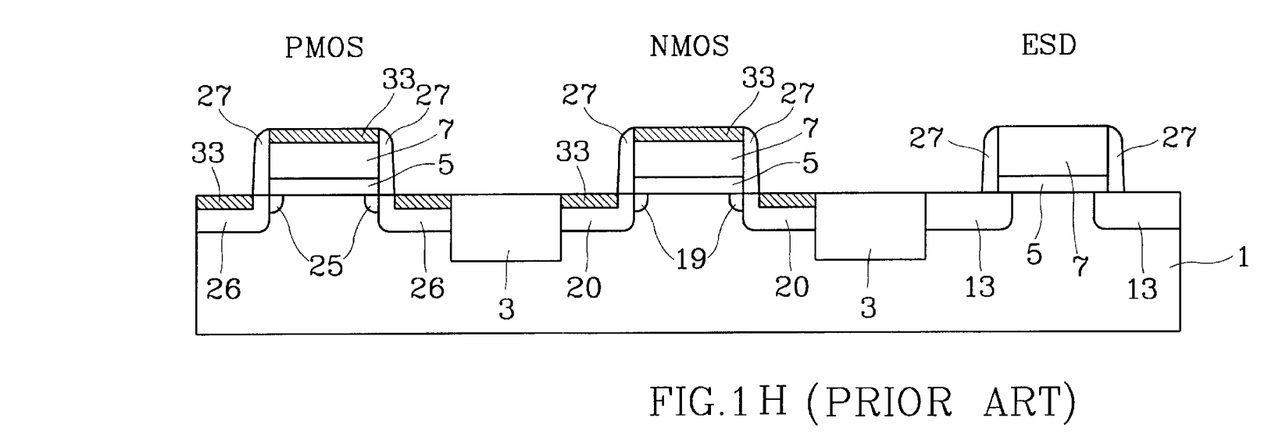

Finally, salicidation is then performed on exposed area such as gates, sources/drains of NMOS and PMOS regions to form a metal silicide layer 33 shown in FIG. 1H. Subsequent processes are interlayer dielectric (ILD) oxide cap, contact opening and metal wiring (not shown in the figures). The conventional fabrication method of an ESD protection circuit without salicide formation is now completed.

As stated above, there are many drawbacks of the conventional ESD protection circuit fabrication process:

1. The numerous process steps from ESD implantation toward salicidation, which includes four masks (ESD, $N^+$, $P^+$ and SAB) and six lithography steps increase the possibility of wafer contamination.

2. It also takes longer time to fabricate the ESD protection circuit that increases the production cost as well.

SUMMARY OF THE INVENTION

Accordingly, it is a primary object of the present invention to provide a method of fabricating an ESD protection circuit without salicide formation for integrated circuit devices.

It is another object of the present invention to provide a method of fabricating an ESD protection circuit without salicide formation by using reduced numbers of masks and lithography steps.

Yet, another object of the present invention is to provide an effective, low-cost and manufacturable method to fabricate an ESD protection circuit without salicide formation.

It is a further object of the present invention is to provide a method to fabricate an ESD protection circuit without salicide formation that decreases the possibility of wafer contamination, and therefore, improves the yield and performance of the integrated circuit devices.

These objects are accomplished by fabricating an ESD protection circuit without salicide formation and salicide CMOS. First, isolation regions and gate structures are formed on a semiconductor substrate, and device regions and ESD circuit regions are then defined. Next, a first dielectric layer is deposited over the entire semiconductor substrate, and ion implantation is performed in ESD circuit regions to form heavily doped source/drain regions. Next, a second dielectric layer is formed over the entire semiconductor substrate. Next, the second dielectric layer and first dielectric layer of NMOS areas are etched to form spacers on the sidewalls of said gate structures. Then, $N^+$ ion implantation is performed to form heavily doped source/drain regions of NMOS. Next, the second dielectric layer and first dielectric layer of PMOS areas are etched to form spacers on the sidewalls of said gate structures. Then, $P^+$ ion implantation is performed to form heavily doped source/drain regions of PMOS. Finally, a metal silicide layer is formed over the surface of the gate, source/drain regions in the device regions. Then rapid thermal anneal is performed to form silicide on the exposed gate and source/drain areas in active device region to complete the so-called salicide process.

BRIEF DESCRIPTION OF THE DRAWINGS

The accompanying drawings forming a material part of this description, in which.

DESCRIPTION OF THE PREFERRED EMBODIMENTS

The invention disclosed herein is directed to a process of fabricating an ESD protection circuit without salicide formation. The drawing figures illustrate a partially completed silicon substrate. In the following description, numerous details are set forth in order to provide a thorough understanding of the present invention. It will be appreciated by one skilled in the art that variations of these specific details are possible while still achieving the results of the present invention. In other instance, well-known processing steps are not described in detail in order not to unnecessarily obscure the present invention.

First Embodiment

Figure 2:
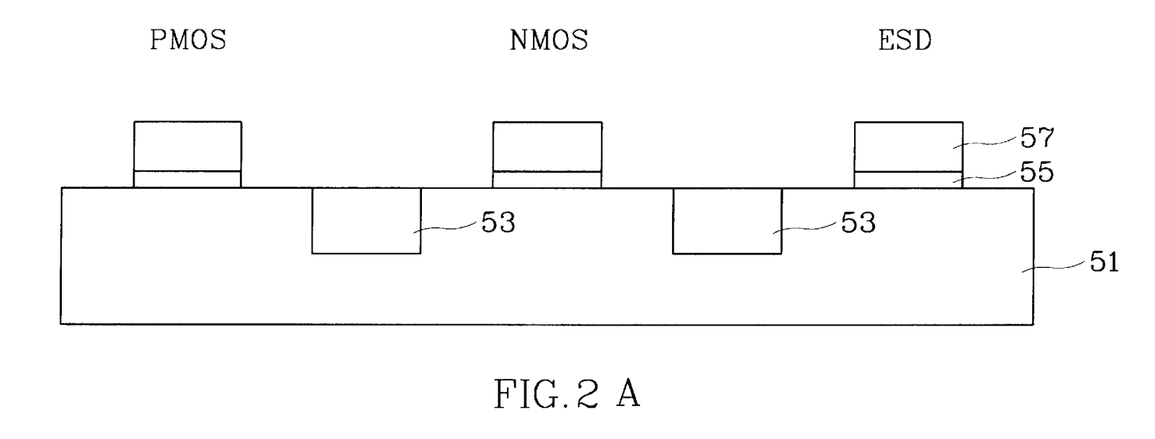
FIGS. 2A to 2H show process representations of an ESD protection circuit without salicide formation according to first embodiment of the present invention.

Referring now more particularly to FIGS. 2A–2H the process before gate patterning is similar to common processes of the prior art, which includes well and isolation 53 formations, $V_{th}$ implantation, gate oxide 55 growth, polysilicon 57 deposition and gate patterning on a monocrystalline P-type silicon substrate 51. In addition, ESD protection circuit and active device regions which includes NMOS and PMOS areas are also defined as shown in FIG. 2A.

Referring now to FIG. 2B, a thin first dielectric layer 59 is deposited over the entire semiconductor substrate 51. Therefore, a first photoresist pattern 61 is formed to mask the active device region. Then, ESD implantation 62 is performed by implanting high dosage $N^+$ ions for ESD protection to form heavily doped source/drain regions 63 of the ESD protection circuit. The first dielectric layer 59 is usually oxide ($SiO_2$) formed by either thermal oxidation or chemical vapor deposition (CVD) techniques to a thickness of about 500 to 1000 Angstroms. The heavily doped source/drain regions 63 of the ESD protection circuit are formed via ion implantation of arsenic ($As^{75}$) or phosphorus ($P^{31}$) ions, with an implantation energy of 30 to 80 keV, and a dosage between about 1E15 to 5 E15 $cm^{-2}$.

Figure 2C:
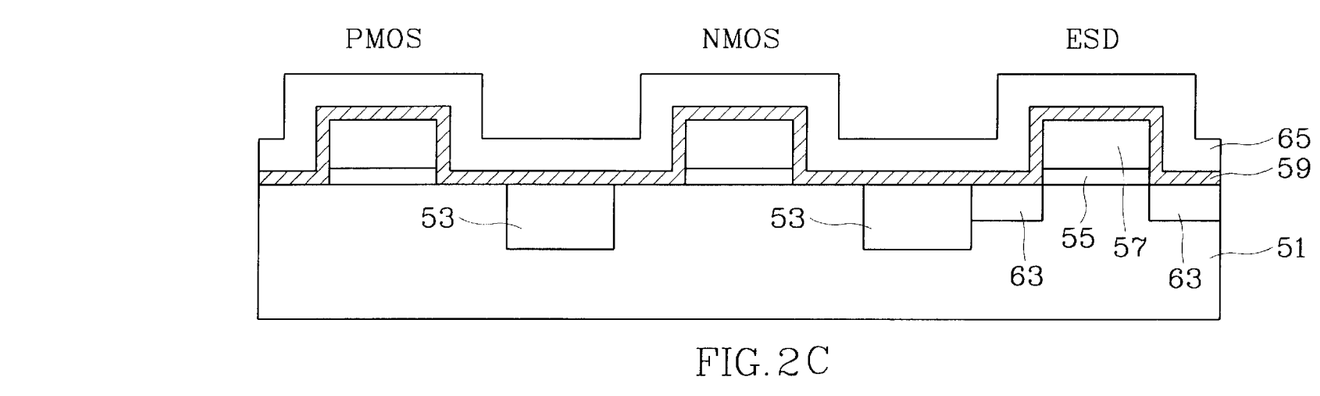

Referring now to FIG. 2C, the first photoresist pattern is removed and another thicker second dielectric layer 65 is capped over the entire semiconductor substrate. The second dielectric layer 65 is usually chemical vapor deposited nitride ($Si_3N_4$) or oxynitride (SiON) with a thickness of about 1000 to 3000 Angstroms.

Figure 2D:
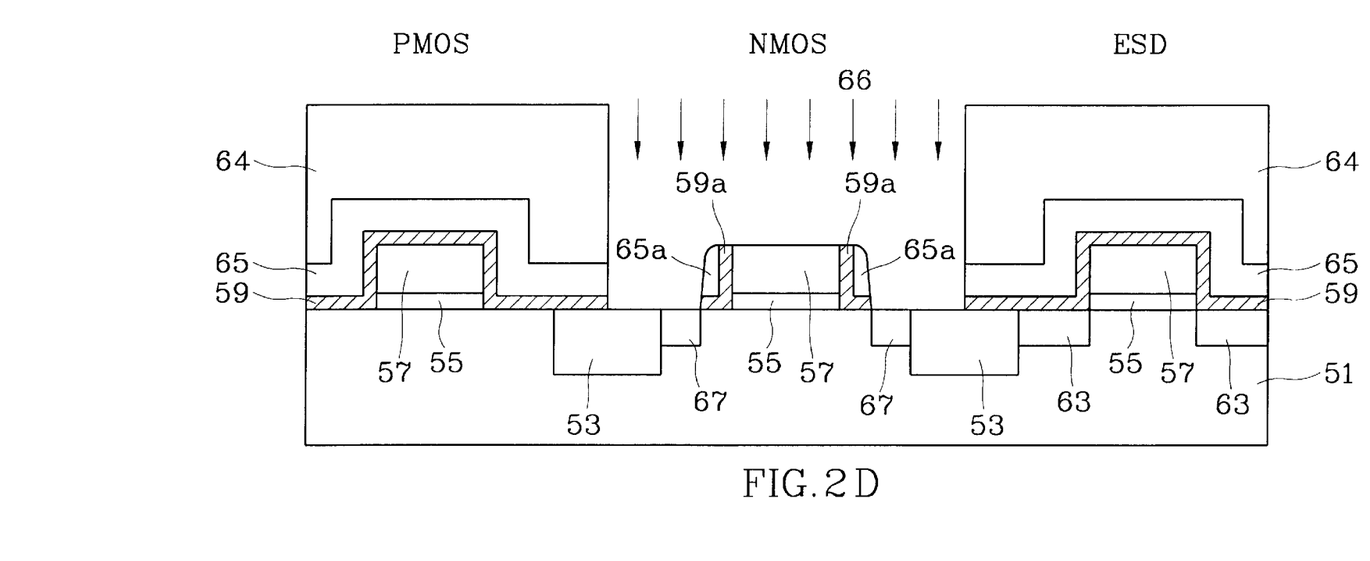

Referring now to FIG. 2D, a second photoresist pattern 64 which is masked PMOS and ESD areas is formed. Next, anisotropic etching is performed to form dielectric spacers which include the remainder of the first dielectric 59a and second dielectric 65a layer on the sidewalls of the gate in NMOS area as shown in FIG. 2D. Then, $N^+$ implantation 66 is executed to form heavily doped source/drain regions 67 of the NMOS areas. Thereafter, the second photoresist pattern 64 is removed after implantation.

Figure 2E:
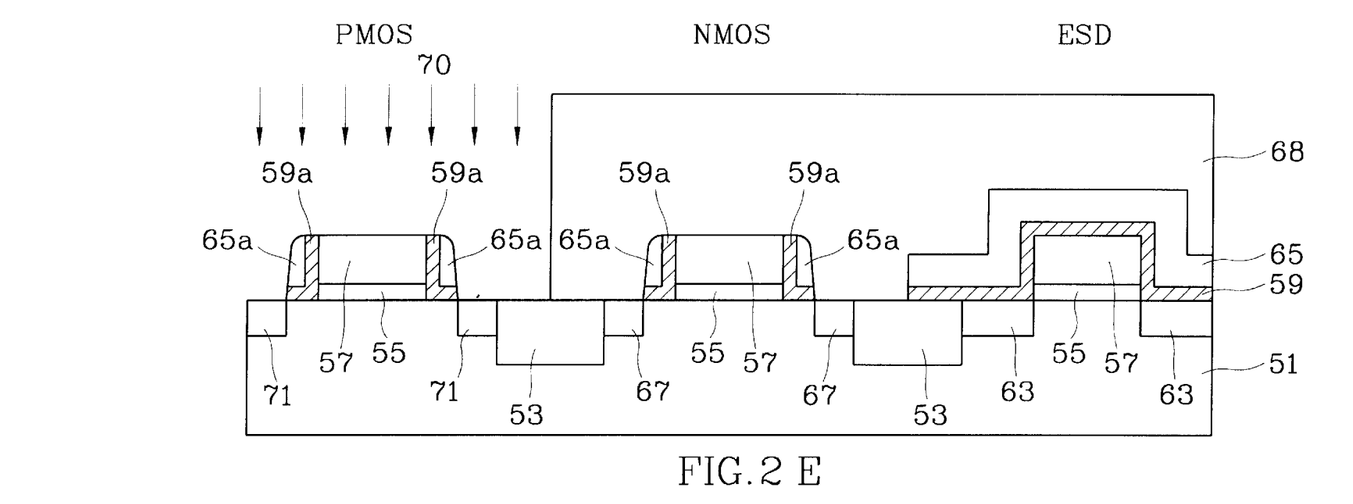

Referring now to FIG. 2E, a third photoresist pattern 68 which is masked NMOS and ESD areas is formed. Next, anisotropic etching is performed once again to form dielectric spacers which include the remainder of the first dielectric 59a and second dielectric 65a layers on the sidewalls of the gate in PMOS area as shown in FIG. 2E. Then, $P^+$ implantation 70 is executed to form heavily doped source/drain regions 71 of the PMOS areas. Thereafter, the third photoresist pattern 68 is removed after implantation.

Figure 2F:
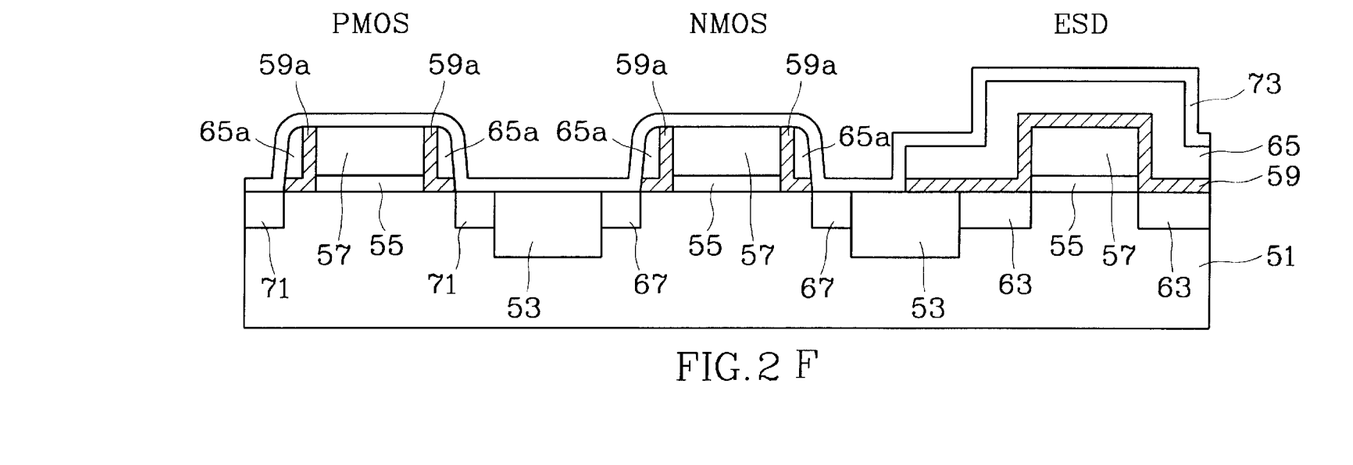
Figure 2G:
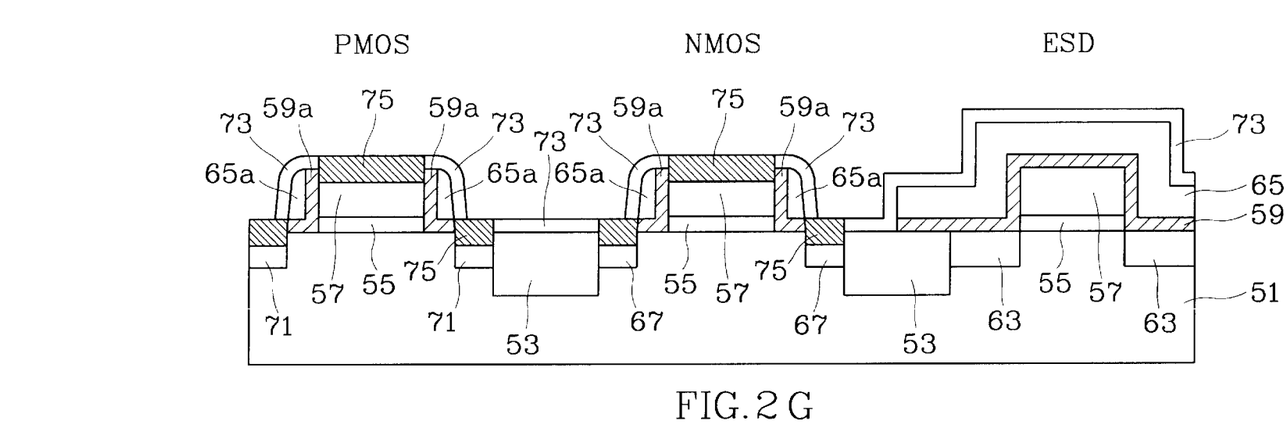

Referring now to FIGS. 2F and 2G, Ti/TiN dual layers 73 are sputtered over the entire semiconductor substrate as shown in FIG. 2F. Then rapid thermal anneal is performed to form titanium silicide ($TiSi_2$) 75 on the exposed gate and source/drain areas in active device region to complete the so-called salicide process as shown in FIG. 2G. Thereafter, the unreacted Ti/TiN dual layers 73 are etched away.

Following salicide, ILD oxide cap, contact opening and metal wiring processes are carried out, which are not shown in the Figures. The fabrication method of an ESD protection circuit without salicide formation according to the present invention is now accomplished.

Figure 2H:
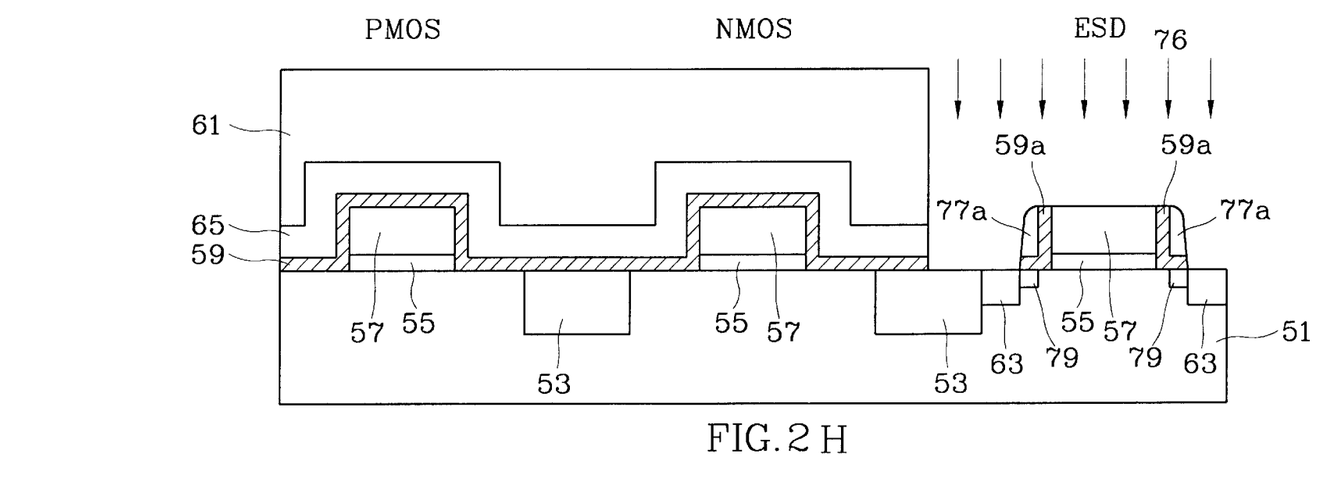

If NLDD and $N^+$ implantation are both necessary to enhance ESD circuit performance, then some processing steps can be modified between the ESD implantation shown in FIG. 2B and the first dielectric layer deposition shown in FIG. 2C. Referring now to FIG. 2H, NLDDs 79 are formed by $N^-$ ion implantation 76 following the ESD implantation. A third dielectric layer is then capped on and spacers which include the remainder of the first dielectric 59a and third dielectric 77a layers are formed as shown in FIG. 2H. After these steps, the process is undertaken with the same steps as described above from FIG. 2C to 2G.

Second Embodiment

Alternatively, FIGS. 3A–3I illustrate another preferred embodiment of the present invention. Basically, the ESD protection circuit is the same as first embodiment described before. The only difference is that the NMOS and PMOS areas are added LDD structure as well. Therefore, the process steps from FIGS. 3A to 3D are the same as the steps in FIGS. 2A to 2D. The same reference numbers represent the same elements of the first embodiment.

Figure 3:
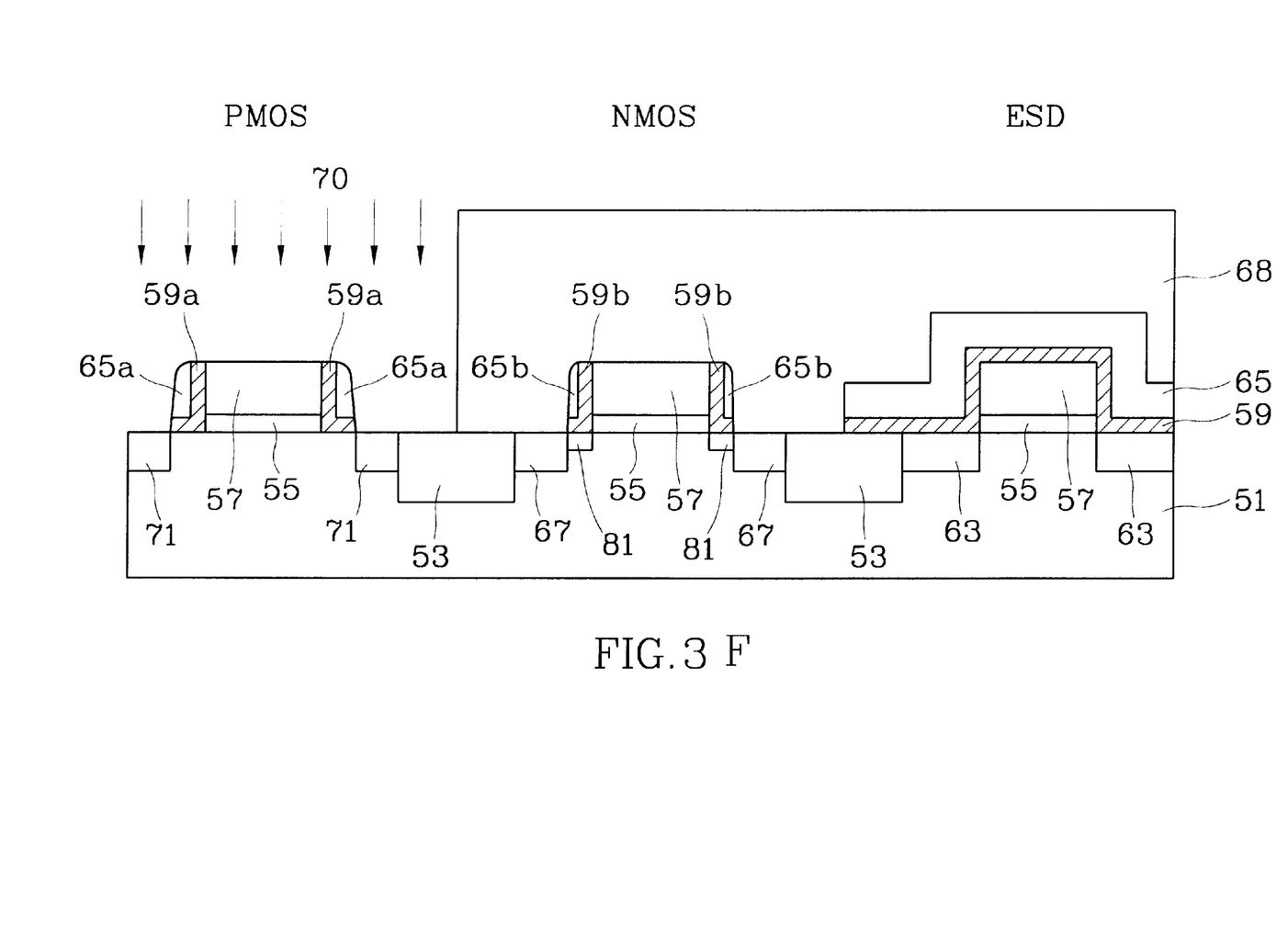
FIGS. 3A to 3I show process representations of an ESD protection circuit without salicide formation according to second embodiment of the present invention.
Figure 3A:
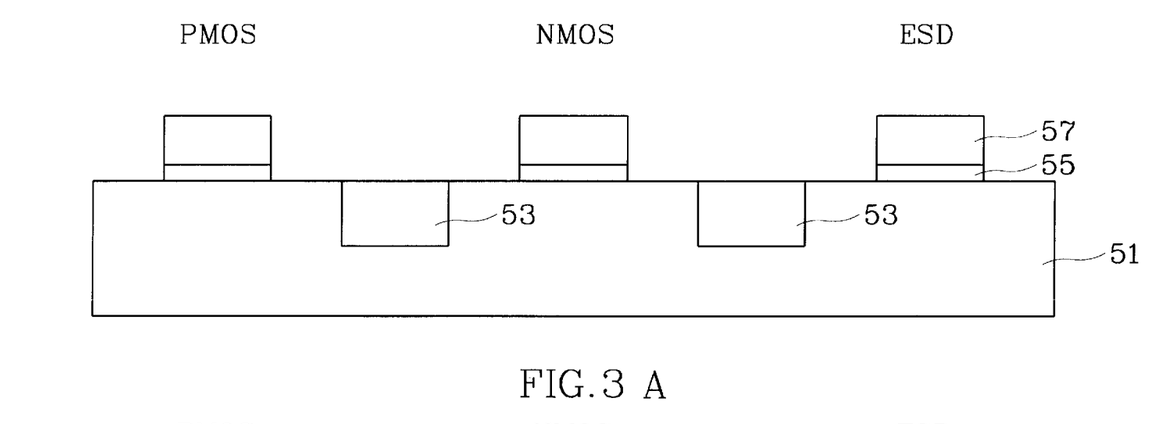
Figure 3B:
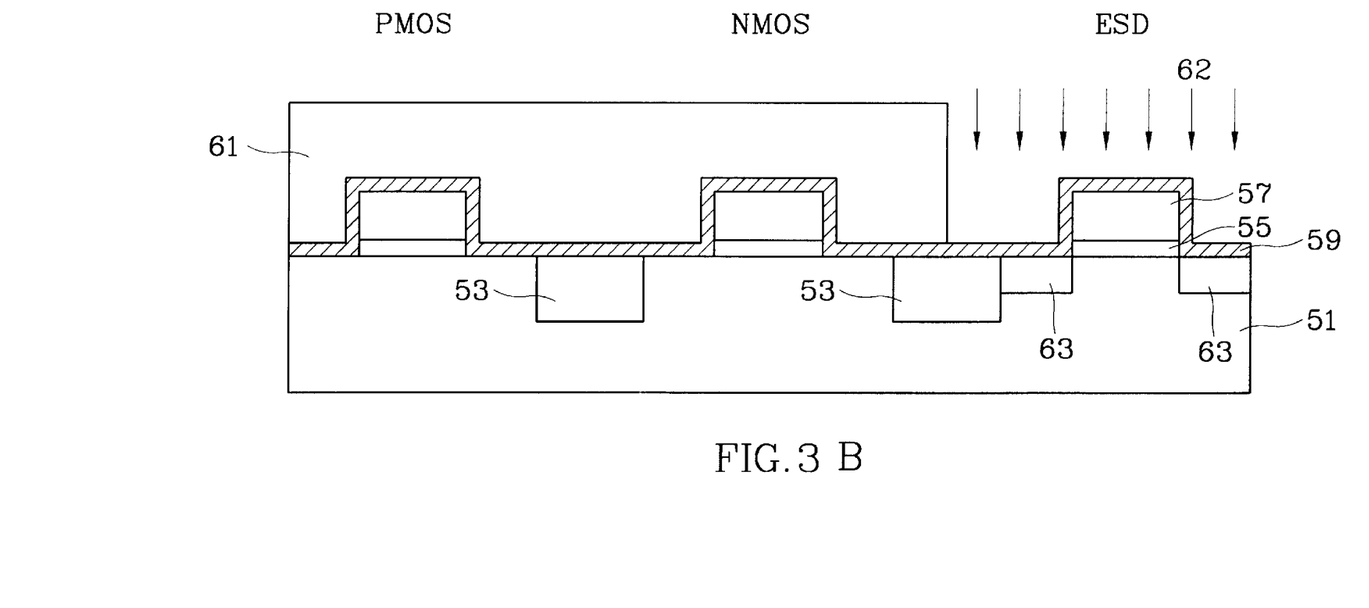
Figure 3C:
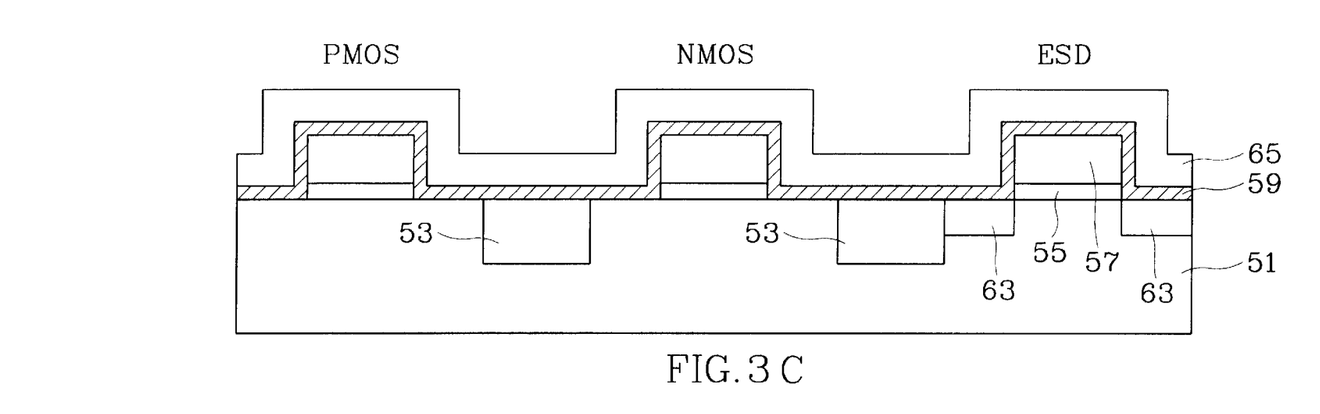
Figure 3D:
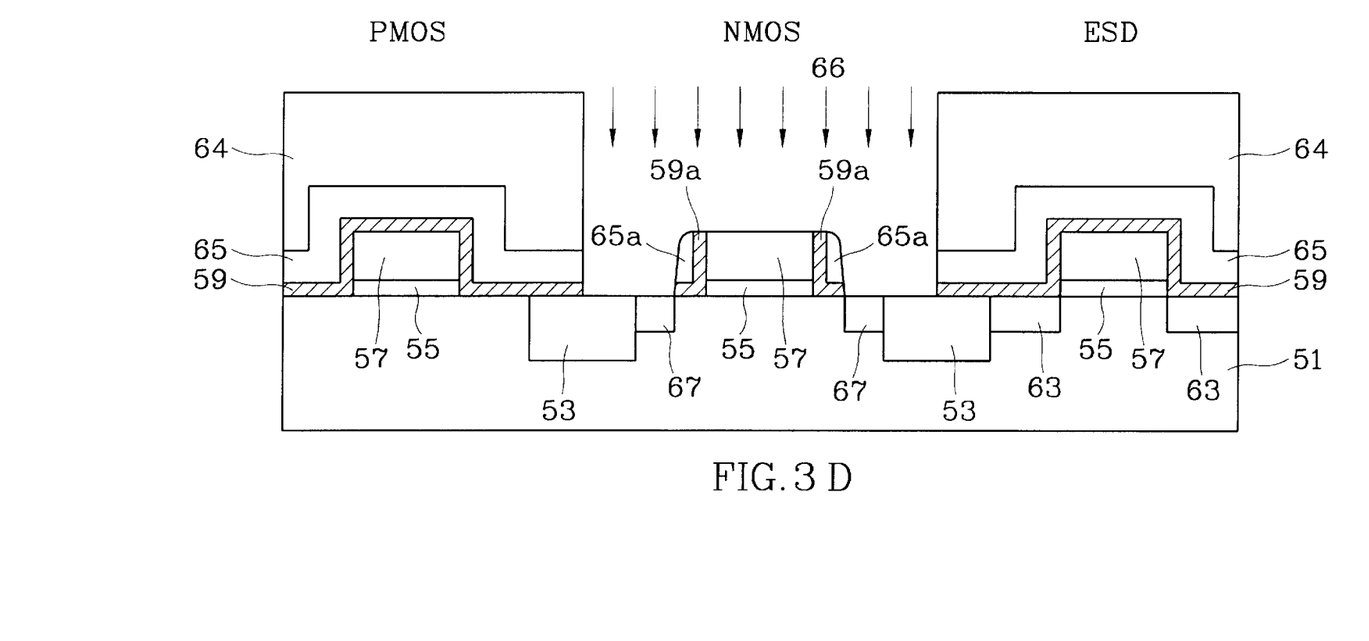
Figure 3E:
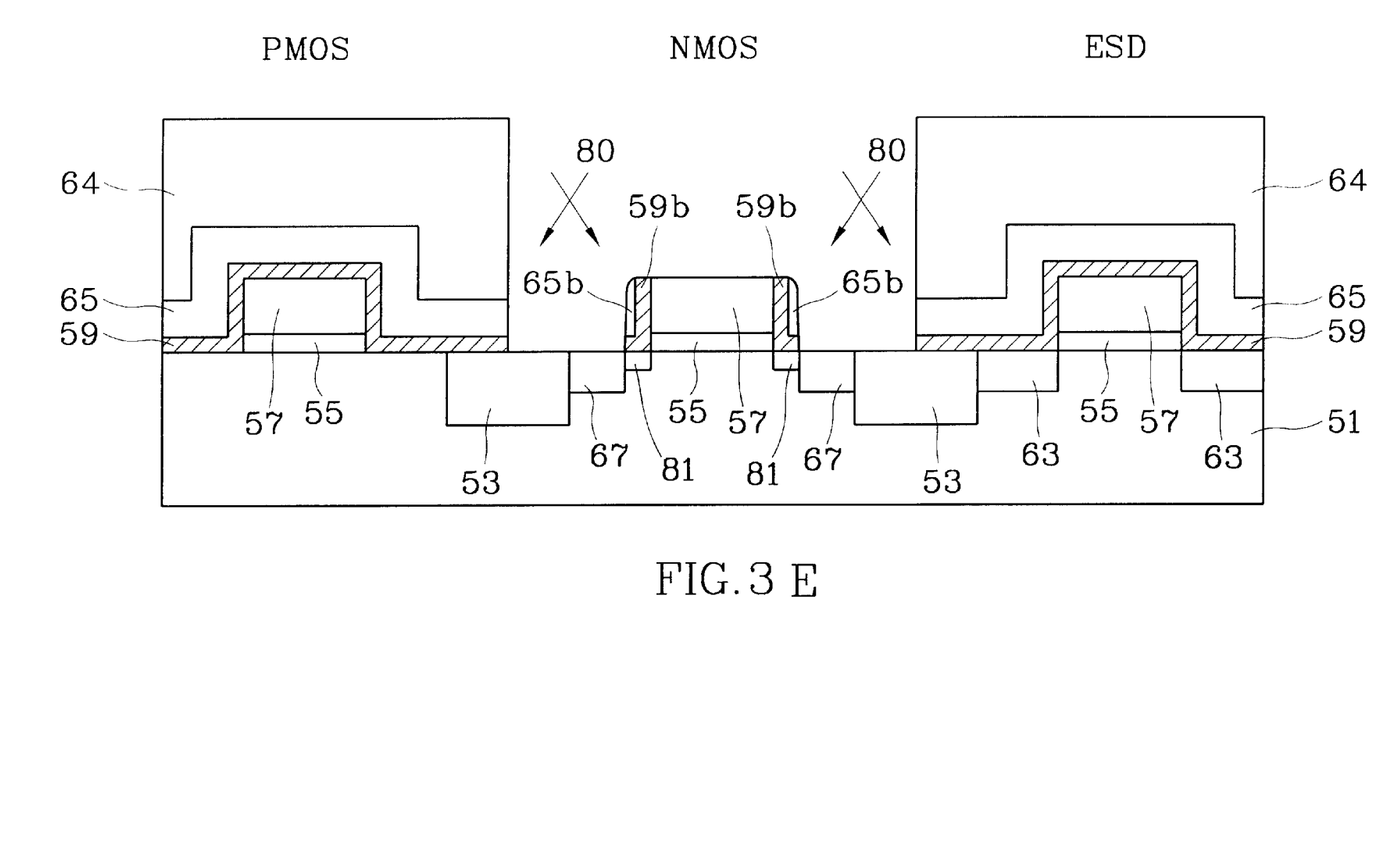

Referring now more particularly to FIG. 3E, the remainder of the first dielectric 59b and second dielectric 65b spacers on the sidewalls of the gate in NMOS area are overetched as shown in FIG. 3E. Then, large angle tilt implantation (LATI) 80 is executed to form NLDD regions 81 of the NMOS areas. Thereafter, the second photoresist pattern 64 is removed after LATI implantation.

Referring now to FIG. 3F, a third photoresist pattern 68 which is masked NMOS and ESD areas is formed. Next, anisotropic etching is performed once again to form dielectric spacers which include the remainder of the first dielectric 59a and second dielectric 65a layers on the sidewalls of the gate in PMOS area as shown in FIG. 3F. Then, P+ implantation 70 is executed to form heavily doped source/drain regions 71 of the PMOS areas.

Figure 3G:
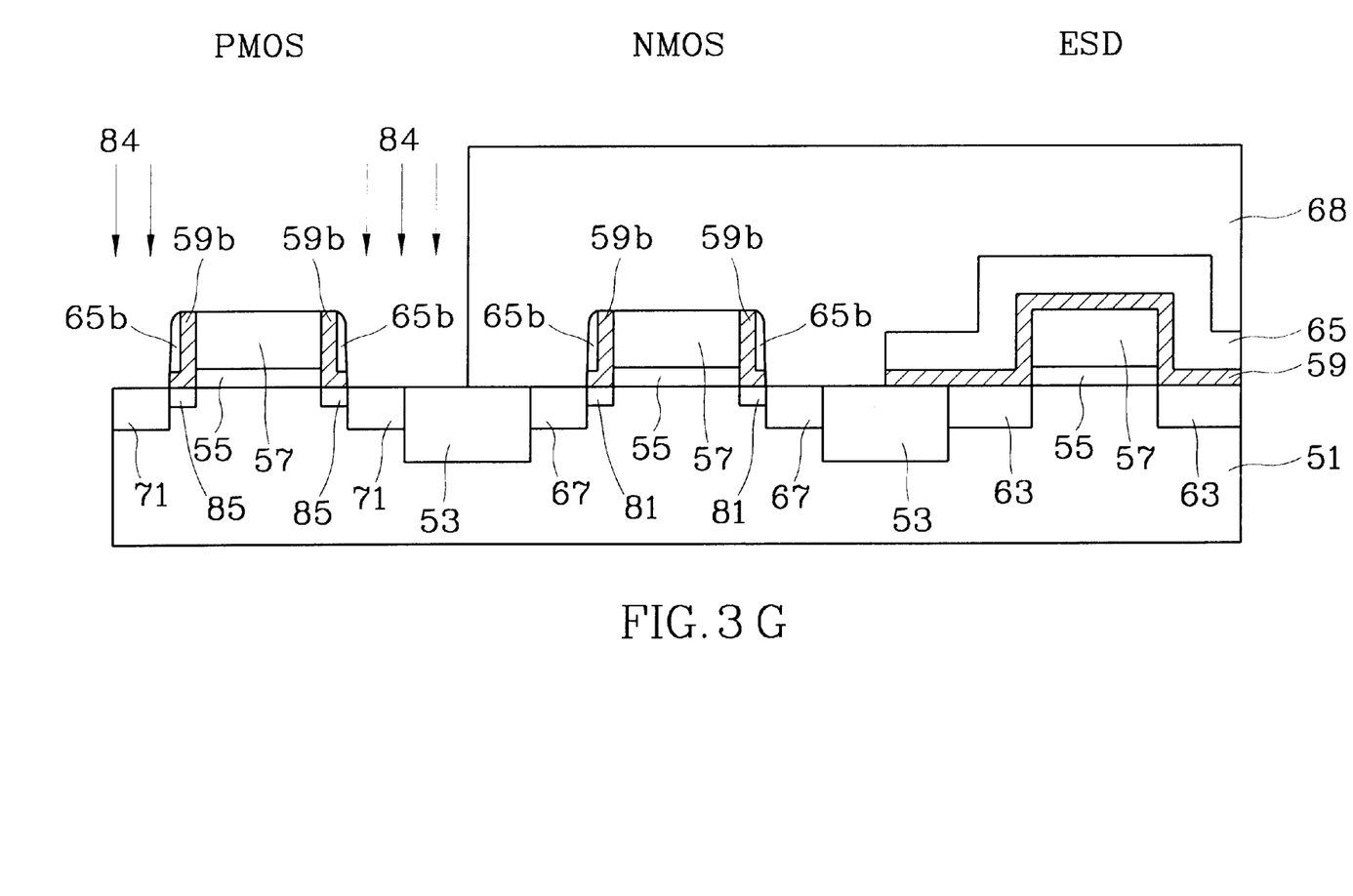

Referring now to FIG. 3G, the remainder of the first dielectric 59b and second dielectric 65b spacers on the sidewalls of the gate in PMOS area are also overetched as shown in FIG. 3G. Then, P− implantation 84 is executed to form PLDD regions 81 of the PMOS areas. Thereafter, the third photoresist pattern 68 is removed after PLDD implantation.

Figure 3H:
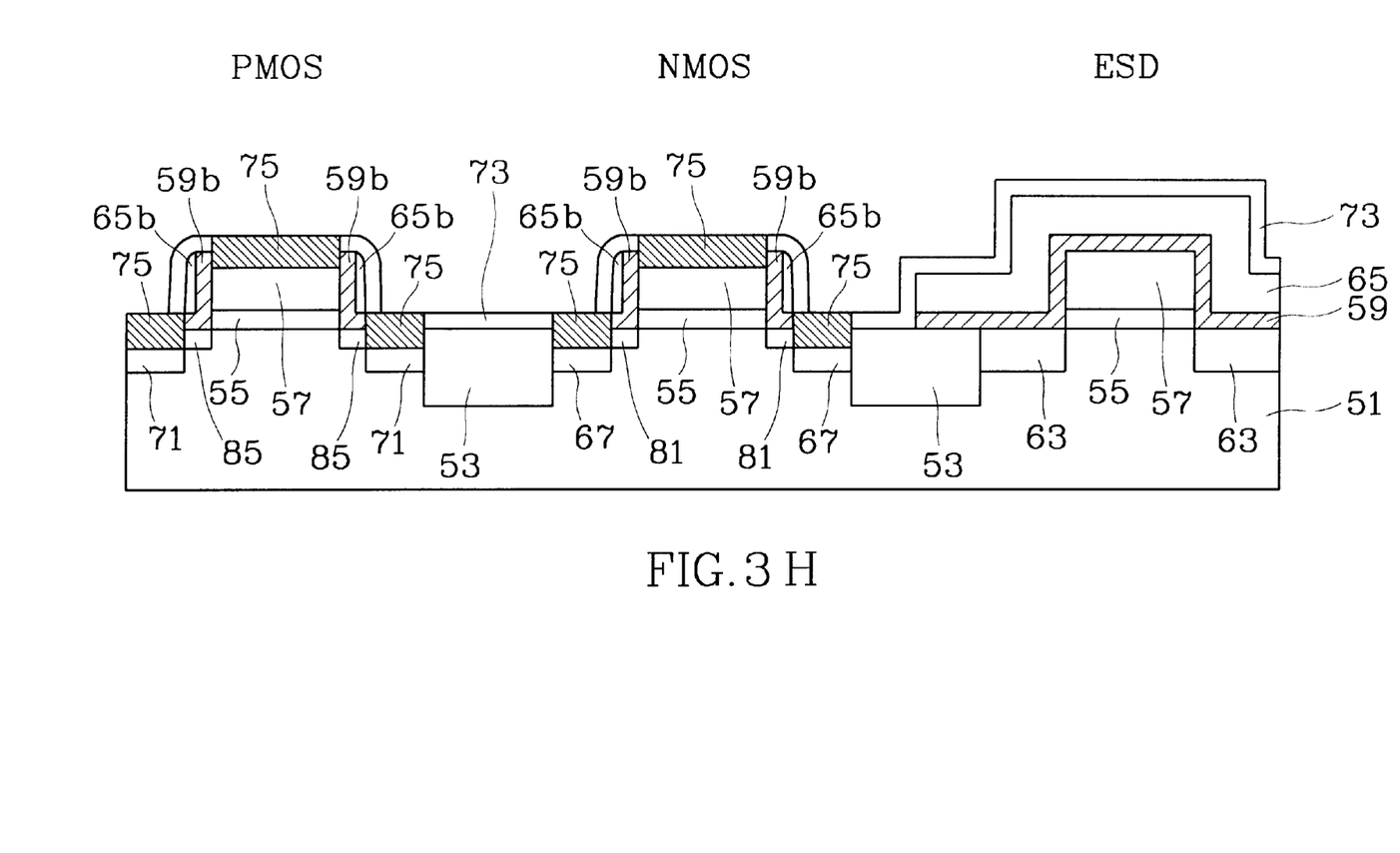

Referring now to FIG. 3H, Ti/TiN dual layers 73 are sputtered over the entire semiconductor substrate. Then rapid thermal anneal is performed to form salicide 75 on the exposed gate and source/drain areas in active device region to complete the so-called salicide process as shown in FIG. 3H. Thereafter, the unreacted Ti/TiN 73 are etched away.

Following salicide, ILD oxide cap, contact opening and metal wiring processes are carried out, which are not shown in the Figures. The fabrication method of an ESD protection circuit without salicide formation according to the present invention is now accomplished.

Figure 3I:
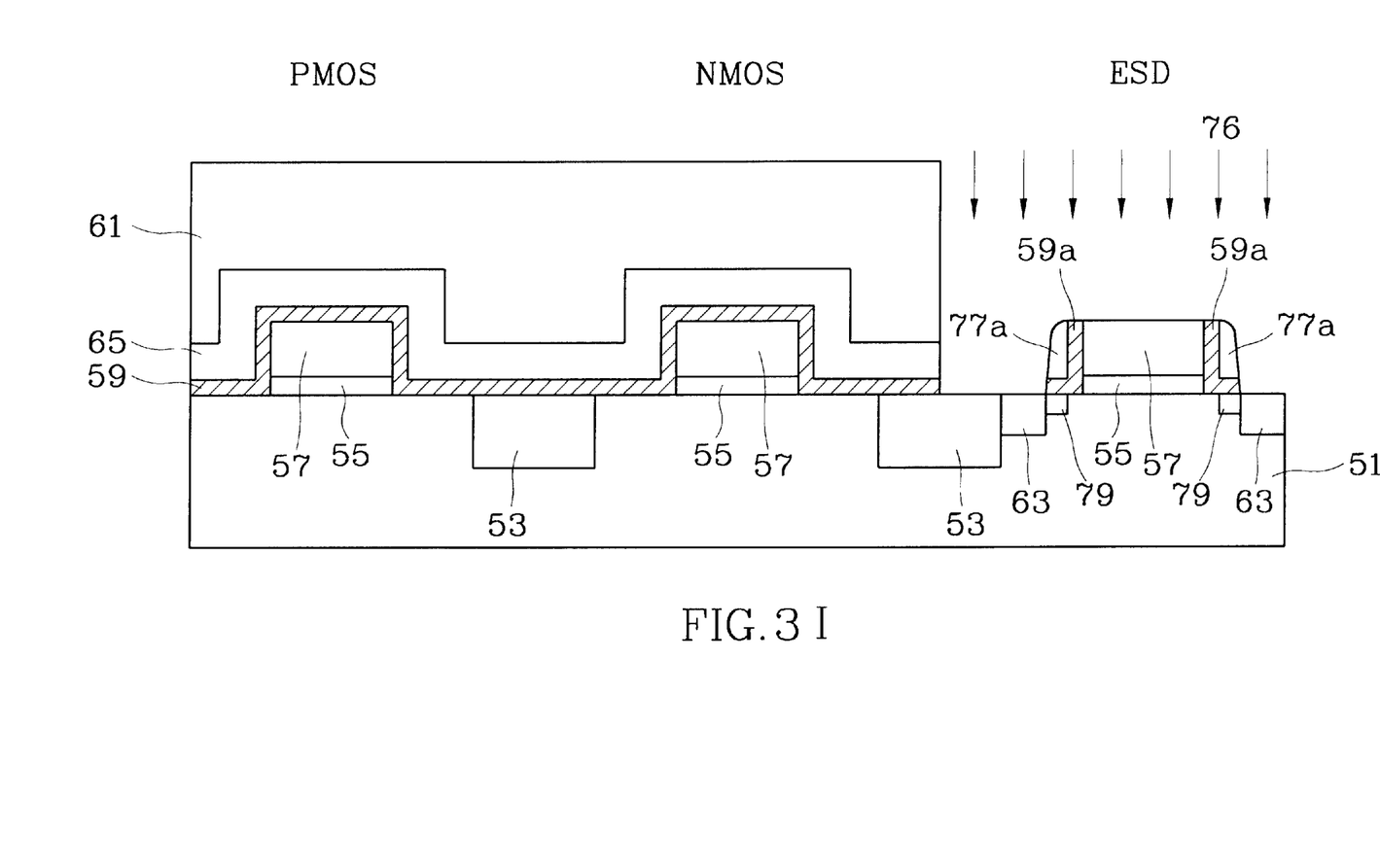

If NLDD and N+ implantation are both necessary to enhance ESD circuit performance, then some processing steps can be modified between the ESD implantation shown in FIG. 3B and the first dielectric layer deposition shown in FIG. 3C. Referring now to FIG. 3I, NLDDs 79 are formed by N− ion implantation 76 following the ESD implantation. A third dielectric layer is then capped on and spacers which include the remainder of the first dielectric 59a and third dielectric 77a layers are formed as shown in FIG. 3I. After these steps, the process is undertaken with the same steps as described above.

There are many advantages of the ESD protection circuit fabrication process according to the present invention:

1. The conventional process steps from ESD implantation toward salicidation, includes four masks (ESD, N+, P+ and SAB) and six lithography steps that increase the possibility of wafer contamination, while the present invention employs double spaces to save one lithography mask that decreases the production cost as well.

2. It also takes shorter work-in-process time to fabricate the ESD protection circuit. Therefore, shorter turn around time can be achieved to accommodate more product orders in a fabrication line.

While the invention has been particularly shown and described with reference to a preferred embodiment, it will be understood by those skilled in the art that various changes in form and detail may be made therein without departing from the spirit and scope of the present invention.

What is claimed is:

1. A method for fabricating an electrostatic discharge protection (ESD) circuit, comprising the steps of:
   (a) providing a semiconductor substrate with preformed isolation regions and gate structures, and then defining device regions and ESD circuit regions, wherein said device regions include first conduction type and second conduction type transistors;
   (b) forming a first dielectric layer over the entire semiconductor substrate;
   (c) performing ion implantation in said ESD circuit regions to form heavily doped source/drain regions;
   (d) forming a second dielectric layer over the entire resulting semiconductor substrate;
   (e) etching said second dielectric layer and first dielectric layer to form spacers on the sidewalls of said gate structures;
   (f) performing first conduction type ion implantation in said device circuit regions to form heavily doped source/drain regions of said first conduction type transistors;
   (g) etching said second dielectric layer and first dielectric layer to form spacers on the sidewalls of said gate structures;
   (h) performing second conduction type ion implantation in said device circuit regions to form heavily doped source/drain regions of said second conduction type transistors; and
   (i) forming a metal silicide layer over the surface of said gate, said source/drain regions in said device regions.

2. The method according to claim 1, further comprising a step of forming lightly doped drains (LDDs) in said ESD circuit regions prior to step (d).

3. The method according to claim 1, wherein said first conduction type and second conduction type transistors are opposite conductor type.

4. The method according to claim 3, wherein said first conduction type is N type.

5. The method according to claim 1, wherein said first dielectric layer is oxide.

6. The method according to claim 1, wherein said first dielectric layer has a thickness of about 500 to 1000 Angstroms.

7. The method according to claim 1, wherein said second dielectric layer is nitride.

8. The method according to claim 1, wherein said first dielectric layer and said second dielectric layer has a thickness of about 1000 to 3000 Angstroms.

9. The method according to claim 1, wherein said metal silicide is titanium silicide ($TiSi_2$).

10. A method for fabricating an electrostatic discharge protection (ESD) circuit, comprising the steps of:
   (a) providing a semiconductor substrate with preformed isolation regions and gate structures, and then defining device regions and ESD circuit regions, wherein said device regions include first conduction type and second conduction type transistors;
   (b) forming a first dielectric layer over the entire semiconductor substrate;
   (c) performing ion implantation in said ESD circuit regions to form heavily doped source/drain regions;
   (d) forming a second dielectric layer over the entire resulting semiconductor substrate;

(e) etching said second dielectric layer and first dielectric layer to form spacers on the sidewalls of said gate structures;

(f) performing first conduction type ion implantation in said device circuit regions to form heavily doped source/drain regions of said first conduction type transistors;

(g) further etching said second dielectric layer and first dielectric layer of said first conduction type transistors, and then performing first conduction type large angle tilt ion implantation (LATI) in said device circuit regions to form LDDs of said first conduction type transistors;

(h) etching, said second dielectric layer and first dielectric layer to form spacers on the sidewalls of said gate structures;

(i) performing second conduction type ion implantation in said device circuit regions to form heavily doped source/drain regions of said second conduction type transistors;

(j) further etching said second dielectric layer and first dielectric layer and then performing second conduction type ion implantation in said device circuit regions again to form LDDs of said second conduction type transistors; and (k) forming a metal silicide layer over the surface of said gate, said source/drain regions in said device regions.

11. The method according to claim 10, further comprising a step of forming LDDs in said ESD circuit regions prior to step (d).

12. The method according to claim 10, wherein said first conduction type and second conduction type transistors are opposite conductor type.

13. The method according to claim 12, wherein said first conduction type is N type.

14. The method according to claim 10, wherein said first dielectric layer is oxide.

15. The method according to claim 10, wherein said first dielectric layer has a thickness of about 500 to 1000 Angstroms.

16. The method according to claim 10, wherein said second dielectric layer is nitride.

17. The method according to claim 10, wherein said first dielectric layer and said second dielectric layer has a thickness of about 1000 to 3000 Angstroms.

18. The method according to claim 10, wherein said metal silicide is titanium silicide ($TiSi_2$).

* * * * *